US012676460B2

(12) United States Patent
Leisher et al.

(10) Patent No.: US 12,676,460 B2
(45) Date of Patent: Jul. 7, 2026

(54) SPECTRAL-BASED CORRECTION OF LASER BAR SMILE

(71) Applicant: Freedom Photonics LLC, Goleta, CA (US)

(72) Inventors: Paul Orville Leisher, Livermore, CA (US); Elliot Michael Burke, Santa Barbara, CA (US)

(73) Assignee: Freedom Photonics, LLC, Santa Barbara, CA (US)

( * ) Notice: Subject to any disclaimer, the term of this patent is extended or adjusted under 35 U.S.C. 154(b) by 551 days.

(21) Appl. No.: 18/323,284

(22) Filed: May 24, 2023

(65) Prior Publication Data

US 2024/0396307 A1 Nov. 28, 2024

(51) Int. Cl.
*H01S 5/40* (2006.01)
*H01S 5/00* (2006.01)

(52) U.S. Cl.
CPC ............ *H01S 5/4025* (2013.01); *H01S 5/005* (2013.01); *H01S 5/4012* (2013.01); *H01S 5/4062* (2013.01); *H01S 5/4087* (2013.01)

(58) Field of Classification Search
CPC ...... H01S 5/005; H01S 5/4012; H01S 5/4025; H01S 5/4062; H01S 5/4087
See application file for complete search history.

(56) References Cited

U.S. PATENT DOCUMENTS

| | | | | |
|---|---|---|---|---|
| 6,192,062 B1 * | 2/2001 | Sanchez-Rubio | ..... | H01S 5/4062 372/98 |
| 9,331,455 B1 * | 5/2016 | Leisher | ................... | H01S 5/141 |
| 2003/0048422 A1 * | 3/2003 | Lowenthal | ........... | H04N 9/3129 348/E5.142 |
| 2003/0193974 A1 * | 10/2003 | Frankel | ................. | H01S 5/4062 372/20 |
| 2004/0090519 A1 * | 5/2004 | Mikhailov | ......... | G02B 19/0014 347/224 |
| 2006/0092995 A1 * | 5/2006 | Frankel | ................. | H01S 5/0609 372/18 |
| 2008/0025353 A1 * | 1/2008 | Govorkov | ........... | H01S 5/02326 372/29.022 |
| 2015/0062891 A1 * | 3/2015 | Deutsch | ............. | G02B 27/0025 362/223 |
| 2016/0329685 A1 * | 11/2016 | Katsura | ................. | G01J 1/4257 |
| 2018/0252929 A1 * | 9/2018 | Tayebati | ................ | G02B 27/14 |
| 2019/0089130 A1 * | 3/2019 | Oyu | ....................... | H01S 5/4012 |

* cited by examiner

*Primary Examiner* — James A Menefee
(74) *Attorney, Agent, or Firm* — Van Pelt, Yi & James LLP

(57) ABSTRACT

A laser light source comprises a laser array comprising a plurality of semiconductor lasers on a diode bar having bar smile. The laser light source uses angular dispersion to distribute different wavelengths of light from the semiconductor lasers into different directions and a partially reflective surface to retroreflect a portion of the light that is normally incident on the reflective surface back to semiconductor lasers to lower the lasing threshold for those wavelengths. A portion of the light normally incident on the partially reflective surface is transmitted therethrough providing an output of the laser light source having increased collimation despite the diode bar exhibiting bar smile.

20 Claims, 8 Drawing Sheets

SPECTRAL-BASED CORRECTION OF LASER BAR SMILE

BACKGROUND

Field of the Invention

Various embodiments of this application relate to the semiconductor laser diode bars, and in particular, improving collimation of laser beams from diode bars having bar smile.

Description of the Related Art

"Bar smile" is a phenomenon wherein laser diodes in a diode bar are positioned along a curve rather than along a straight line as shown in FIG. 1. This bending of the row of diode lasers arises due to thin film stresses and coefficient of thermal expansion mismatch between the diode laser substrate, solder material, and/or the heatsink/submount. The result is that different laser emitters along the width of the diode bar (e.g., in the direction parallel to the slow axis of the laser emitters) are positioned at a slightly different heights along the growth direction (e.g., direction parallel to the fast axis of the laser emitters). Bar smile leads to an increased divergence angle envelope after collimation using a single fast-axis collimating lens because different emitter sit at slightly different object field positions.

SUMMARY

Various designs described herein are capable of reducing this excess divergence post-collimation resulting from bar smile. For example, various systems and methods disclosed herein utilize the incorporation of a diffractive optical element (DOE) and partially reflective/partially transmissive output coupler element configured to effectively reduce the lasing threshold for certain operating wavelengths that are redirected to point in a common direction while decreasing the contribution of other wavelengths that produce the mis-pointing as a result to bar smile.

Some implementations comprise, for example, a laser light source comprising a semiconductor laser array (e.g., diode bar), collimating optics, a diffractive optical element (DOE) and a partially reflective surface. The semiconductor laser array comprises a plurality of semiconductor lasers arranged along a first direction (e.g., parallel to the slow axis of the semiconductor lasers). At least some of the semiconductor lasers have different positions along a second direction (e.g., parallel to the fast axis of the semiconductor lasers) that is orthogonal to the first direction. The plurality of semiconductor lasers include first and second semiconductor lasers having different positions both along the first and second directions. The first and second semiconductor lasers output diverging beams of laser light having a bandwidth that includes a plurality of wavelengths.

The collimating optics (e.g., one or more lenses) are disposed to receive the laser light from the first and second semiconductor lasers and are configured to transmit light from the first and second semiconductor lasers that is more collimated.

A diffractive optical element or DOE is disposed to receive light from the first and second lasers that is transmitted through the collimating optics. The DOE is configured to diffract different wavelengths of the plurality of wavelengths at different angles.

A reflective surface that is partially reflective and partially transmissive is positioned to receive the diffracted light and reflect a portion of the diffracted light back to the DOE.

At least a portion of light from the first semiconductor laser has a first wavelength that is incident on the DOE and transmitted through the DOE at an angle normal to the partially reflective surface such that at least some of the light is retroreflected back to the DOE, transmitted through the DOE and the collimating optics back to the first semiconductor laser to provide feedback to the first laser and reduce the lasing threshold of the first semiconductor laser for the first wavelength. Of course, the first semiconductor laser does not necessarily output a single wavelength but rather a narrow band of wavelength potentially having a center wavelength or peak wavelength corresponding, for example, to the first wavelength. A portion of light from the second semiconductor laser having a second wavelength is incident on the DOE at an angle and is diffracted so as to be normal to the reflective surface such that at least some of the light is retroreflected back to the DOE, diffracted by the DOE, and transmitted through the collimating optics back to the second semiconductor laser to provide feedback to the second semiconductor laser and reduce the laser threshold of the second laser to the second wavelength. Of course, the second semiconductor laser does not necessarily output a single wavelength but rather a narrow band of wavelength potentially having a center wavelength or peak wavelength corresponding, for example, to the second wavelength.

At least a portion of the light from said first and second semiconductor lasers is transmitted through the reflective surface. In some cases, light from at least the second semiconductor laser that is transmitted through the reflective surface is more parallel than the light from the second semiconductor laser that is incident on the DOE.

Additionally, in various designs, a portion of the light from the second semiconductor laser has the first wavelength and is incident on the DOE at an angle and diffracted so as not to be normal to the partially reflective surface and thus not to be retroreflected back to the DOE the collimating optics, and the second semiconductor laser to provide feedback to the second semiconductor laser to reduce the lasing threshold of the second semiconductor laser for the first wavelength. Similarly, a portion of the light from the first semiconductor laser has the second wavelength different from said the first wavelength that is incident on the DOE at an angle and is diffracted so as not to be normal to the partially reflective surface and not to be retroreflected back to the DOE, the collimating optics, and the first semiconductor laser to provide feedback to reduce the lasing threshold of the first semiconductor laser for the second wavelength.

As discussed above, the partially reflective surface will retro-reflect those wavelengths from the different lasers that are incident on the reflective surface at a normal back to the respective lasers from which they originated. This feedback will reduce the lasing threshold for those lasers, which will cause lasing at those wavelengths to be more efficient. The lasers will more preferentially lase at these wavelength as opposed to other wavelengths in the respective laser cavities that do not receive such feedback. The lasing of these wavelengths will thus become stronger and these wavelengths will be the dominant wavelengths for those lasers. The lasers become effectively locked to these respective center or peak wavelengths. Of course, the laser does not necessarily output a single wavelength but rather a narrow band of wavelength potentially having a center wavelength or peak wavelength corresponding, for example, to the wavelengths that are normally incident on the partially reflective partially transmissive surface and feed back to the respective lasers.

Moreover, because these wavelengths are diffracted so as to be normal to the partially reflective partially transmissive surface of the reflector/output coupler, a portion of this light will be transmitted through the reflector/output coupler and be output from the laser light source 100. As the light from individual lasers such as the first and second lasers is now output generally normal to the partially reflective partially transmissive surface and thus in generally the same direction. Likewise, the laser light output by the output coupler is more collimated than the laser light received by the diffractive optical element. As discussed above and shown in FIGS. 2, the DOE receives collimated light from different lasers such as from the first and second lasers, however, the light from the different lasers is pointed in different directions due to the differences in spatial location, for example, the different in the height of the different emitters as a result of smile. The differently pointed collimated beams from the individual lasers cause the aggregate beam to be diverging and less collimated. In contrast, the addition of the DOE and partial reflector/output coupler, appropriately designed as described herein, may output primarily light that is normal to the partially reflective partially transmissive surface of the reflector/output coupler, which because this light is directed largely in the same direction (e.g., normal to the partially reflective surface), will be more collimated. In some implementations, instead of employing a DOE, a prism having angular dispersion wherein different wavelengths are refracted by different amounts may be employed. Similarly, other optical element having angular dispersion may be used such that different wavelengths are directed in different directions by the optical element as a result of angular dispersion.

Accordingly, various implementations comprise a laser light source may comprises a semiconductor laser array, a collimation region, a dispersion region having angular dispersion, and a partially reflective surface/output coupler. The semiconductor laser array may comprise a diode bar having smile. The collimation region may comprise collimating optics such as one or more lenses (e.g., a cylindrical or acylindrical lens). The dispersion region may comprise, for example, a diffractive optical element or prism that respectively diffracts or refracts different wavelengths at different angles. The partially reflective surface/output coupler may be partially reflective and partially transmissive such that the partially reflective surface may operate to couple light out of the light source. This light coupled out of the laser light source may be more collimated than the light output from the collimation region or collimating optics.

The semiconductor laser array comprises a plurality of semiconductor lasers arranged along a first direction axis. At least some of the semiconductor lasers also having different positions along a second direction orthogonal to the first direction. The plurality of semiconductor lasers includes first and second semiconductor lasers having different positions both along the first and second directions. The first and second semiconductor lasers output diverging beams of laser light having a bandwidth that includes a plurality of wavelengths.

The collimation region is disposed to receive laser light from the first and second semiconductor lasers and is configured to transmit laser light from the first and second semiconductor lasers that is more collimated. The dispersion region having angular dispersion is disposed to receive light from the first and second lasers that is transmitted through the collimation region. The dispersion region is configured to distribute different wavelengths of the plurality of wavelengths in different directions along different angles.

The partially reflective surface, which is partially reflective and partially transmissive, is positioned to receive the different wavelengths from the dispersion region and reflect a portion of the light back to the dispersion region. At least a portion of light from the first semiconductor laser has a first wavelength and is incident on the dispersion region and transmitted through or reflected from the dispersion region at an angle normal to the partially reflective surface such that at least some of the light is retroreflected back to the dispersion region, onto the collimation region and to the first semiconductor laser to thereby lower the laser threshold of the first semiconductor laser for the first wavelength. At least a portion of light from the second semiconductor laser has a second wavelength and is incident on the dispersion region at an angle and transmitted through or reflected form the dispersion region at an angle normal to the partially reflective surface such that at least some of said light is retroreflected back to said dispersion region onto said collimation region to the second semiconductor laser thereby lowering the lasing threshold of the second semiconductor laser for the second wavelength.

Additionally, in various designs, a portion of the light from the second semiconductor laser has the first wavelength and is incident on the dispersion region at an angle and diffracted so as not to be normal to the partially reflective surface and thus not to be retroreflected back to the dispersion region, the collimating optics, and the second semiconductor laser to provide feedback to the second semiconductor laser to reduce the lasing threshold of the second semiconductor laser for the first wavelength. Similarly, a portion of the light from the first semiconductor laser has the second wavelength different from said the first wavelength that is incident on the dispersion region at an angle and is diffracted so as not to be normal to the partially reflective surface and not to be retroreflected back to the dispersion region, the collimating optics, and the first semiconductor laser to provide feedback to reduce the lasing threshold of the first semiconductor laser for the second wavelength.

Example embodiments described herein have several features, no single one of which is indispensable or solely responsible for their desirable attributes. Without limiting the scope of the claims, some of the advantageous features will now be summarized.

BRIEF DESCRIPTION OF THE DRAWINGS

In the following description of the various embodiments, reference is made to the accompanying drawings which form a part hereof, and in which is shown by way of illustration various embodiments of the device. It is to be understood that other embodiments may be utilized and structural changes may be made.

DETAILED DESCRIPTION

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements may be present therebetween. For clarity of description, "reflector" or "mirror" can be used interchangeably to refer to an optical element and/or a surface having a reflectivity greater than or equal to about 5% and less than or equal to 100%. For example, an optical element and/or a surface having a reflectivity greater than or equal to about 5% and less than or equal to 99%, greater than or equal to about 10% and less than or equal to 90%, greater than or equal to about 15% and less than or equal to 80%, greater than or equal to about 20% and less than or equal to 70%, greater than or equal to about 30% and less than or equal to 60%, or any value in any range/sub-range defined by these values can be considered as a reflector or mirror. It will be understood that "light having single wavelength". "laser light having single wavelength", "single wavelength light" or "single wavelength laser light", can be light comprising wavelengths within a continuous wavelength or frequency band (e.g., a narrowband) centered around a center wavelength (or center frequency).

Figure 1:
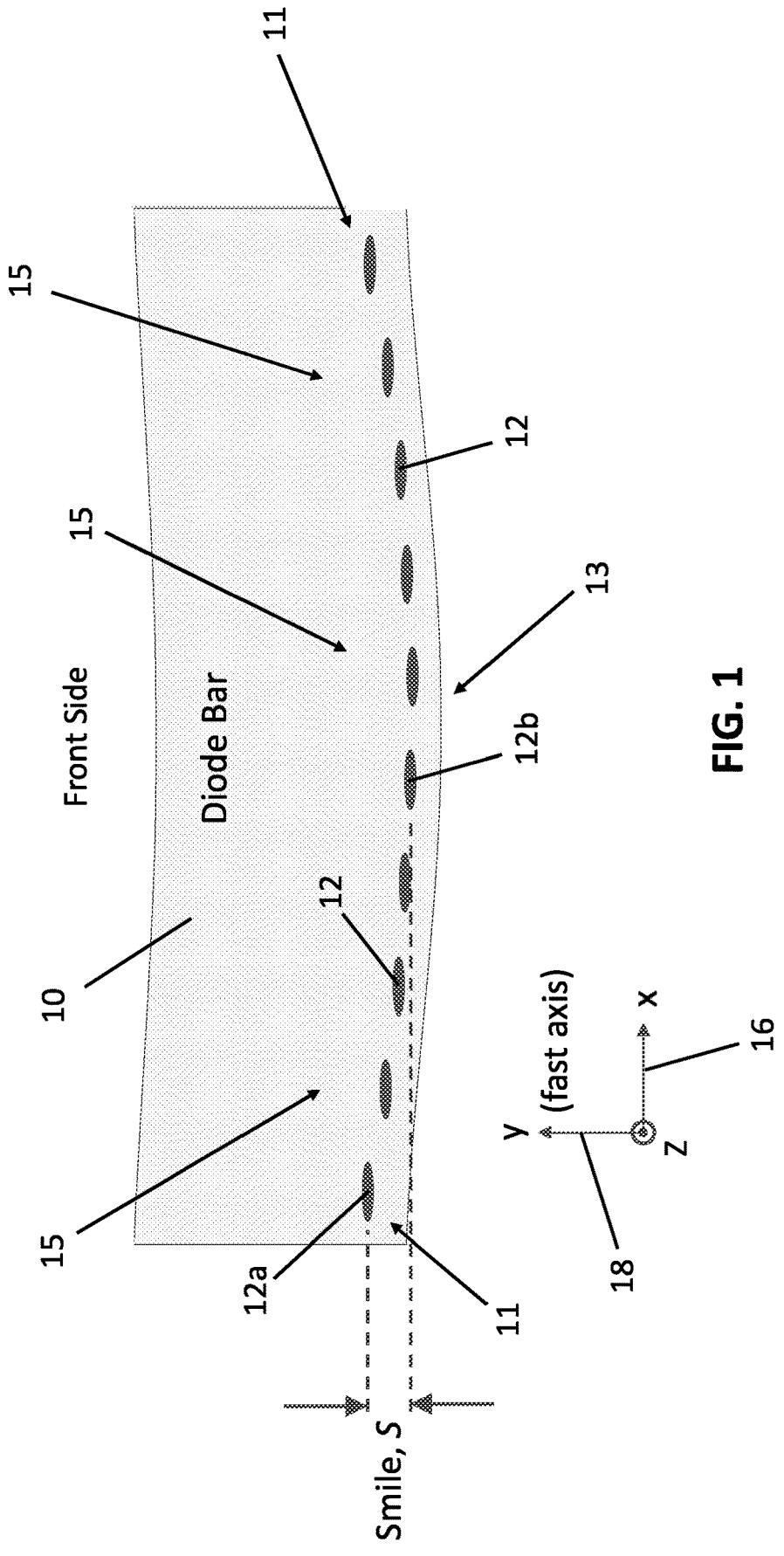
FIG. 1 is a front view of a laser diode bar depicting how the plurality of semiconductor lasers in the array of lasers are positioned along a curved path (e.g., bar smile).

As discussed above and shown in FIG. 1, "bar smile" is the warping of a diode array chip or diode bar 10 along the growth direction. FIG. 1 shows a plurality of semiconductor laser emitters 12, possibly referred to herein as lasers or emitters, in an array 15 that exhibits "bar smile" and being arranged along a curved (rather than a straight) path. This curved path is the origin of the term "smile", i.e., "bar smile", because, like a smile, semiconductor lasers 12 at the ends 11 (e.g., a first laser diode 12a) are raised with respect to semiconductor lasers (e.g., a second laser diode 12b) in the middle 13. As illustrated, the plurality of semiconductor laser emitters 12 are located at different positions across the horizontal direction (e.g., parallel to the x-axis 16) in FIG. 1. In various implementations, the semiconductor lasers 12 comprise waveguides having a shorter height (in the vertical direction or parallel to the y-axis 18 in this case) than width (in the horizontal direction or parallel to the x-axis 16 in this case). As a result, the beam exiting the waveguide expands more rapidly in the vertical direction (parallel to the y-axis 18) than in the horizontal direction (parallel to the x-axis 16). Likewise, the vertical direction in this case, where the beam expands more rapidly, is referred to as the "fast axis" 18 while the orthogonal horizontal direction in this case, where the beam expands less quickly, is referred to as the "slow axis" 16. Of course, the diode bar 10 can be rotated and have different orientations. For example, the diode bar 10 can be rotated 90° such that the fast axis 18 is in the horizontal direction and the slow axis 16 is in the vertical direction. Similarly, the array 15 of laser emitters 12 can extend along the vertical direction with different lasers shifted in the orthogonal horizontal direction with respect to each other to produce the smile, which is now rotated as well by 90°. Other orientations can be achieved by rotating the diode bar 10 by any amount. Accordingly, the term width in reference to the array 15 of laser diodes 12 may be used herein to refer to the direction in which the plurality of emitters (e.g. 8, 10, 15, 20, 25 etc.) are spread across the array (x direction in FIG. 1) while the height may be used herein to refer to the orthogonal direction, for example, over which the individual emitters are shifted with respect to adjacent emitters to ultimately produce the curvature of the curved path of the smile (y direction in FIG. 1).

In various implementations, the diode bar 10 comprises a plurality of laser diodes 12 formed from one or more layers such as doped semiconductor layers on a semiconductor substrate. The layers of semiconductor may be fabricated, e.g., epitaxially grown, on the semiconductor substrate. The layers may comprise, for example, p and n type layers that form a quantum well and a p-n junction. One or more semiconductor layers can be doped sufficiently such that application of electrical power to the p-n junction causes forward biasing and provides optical gain to light within the laser 12. In some cases, the layers may also include an upper cladding, a core, and a lower cladding that form a waveguide for vertical and horizontal waveguide confinement of light. In some cases, the waveguide may comprise a ridge waveguide, for example, where upper cladding function is provided by air and the lower cladding need not be a separate layer of material from the core region produced by the ridge. Other configurations and types of waveguides may be employed.

In some cases, the laser diodes 12 may of the diode bar 10 can be fabricated on different material platforms including but not limited to compound semiconductor materials comprising GaN, GaAs, InP, or InSb material. For example, the laser diodes 12 may comprise GaN to generate light having wavelengths in the range 220 nm-500 nm, GaAs to generate light having wavelengths in the range 630 nm-1100 nm, InP to generate light having wavelengths in the range 1200-2100 nm, or InSb to generate light having wavelengths in the range 1500-5000 nm.

As discussed above, in some designs, the cross-section of the core region of the waveguide orthogonal to the direction of output of the laser beam may be asymmetric, for example, rectangular, and may be wider (e.g., in the x direction) than high (e.g., in the y direction). Likewise, the near field beam shape or mode shape of the output beam upon output from the waveguide and/or diode bar 10 may be asymmetric, e.g., elongate, elliptical or oval-shaped, as shown in FIG. 1. As discuss above, this beam will more rapidly diverge in the along the direction of the fast axis 18 as compared to the direction of the slow axis 16. Also as stated above, the plurality of laser diodes 10 may be arranged across the width of the diode bar 10 (e.g., in the x direction, along a direction parallel to the x-axis 16), however, because of the smile, instead of being arranged in a straight line, the positions of the lasers 12 follow an arcuate path. Different lasers 12a have different heights or positions along the vertical direction (direction parallel to y or fast axis 18) than other lasers 12b. Generally, lasers 12b in a central region 13 of the array 15 of lasers 12 are lower than lasers 12a toward the ends 11 of the array. Once again, the diode bar 10 may be rotated any amount. For example, the diode bar may be rotated 90° with the array 15 of laser diodes 12 arranged across a vertical direction and the shifts in individual diode lasers with respect to adjacent emitters being in the horizontal direction.

The diode bar 10 may be mounted on a heatsink which may comprise, for example, metal. Solder may be employed to bond the substrate to the heatsink in certain designs. However, other configurations are possible.

As referenced above, the "bar smile" arises from thin film stresses, internal strain (for example, within the quantum well), coefficient of thermal expansion mismatch between the any combination of the diode bar, solder, and heatsink, and/or the process used to attach a diode bar 10 to the heatsink. These factors cause emitters 12 positioned across the width of the bar (e.g., in a direction parallel to the x-axis or the slow axis 16) to be positioned at different relative heights (e.g., in a direction along y or fast axis 18) in the example shown in FIG. 1.

In various designs, the laser diodes 12 have facets on the front and/or rear. Laser light may, for example, exit the front facet of the laser diode 12 in the general direction forward of the laser (e.g., in a direction parallel to the z axis). The facets may be at least partially reflecting to form reflectors that produce a laser cavity in some cases. In other cases, one or more of the lasers 12 comprise reflectors such as Distributed Bragg Reflectors (DBR) that assist in forming the optical cavity. Other configurations and designs are possible.

Light exiting the front of the laser 12 will diverge. As discussed above, the divergence in the direction along the fast axis (e.g., parallel to the x axis) 18 is greater or faster than divergence in the direction along the slow axis (e.g., parallel to the x axis) 16. For example, the divergence angle may be larger in the along the fast axis (e.g., vertical direction) than along the slow axis (e.g., horizontal direction), e.g., in the far field.

Light emitted by diode laser bar arrays 15 may be collimated in the direction of the fast axis 18 using collimating optics 25, such as a single fast-axis collimating optic (e.g., a cylindrical lens or acylindrical lens, respectively, having a circular or aspheric cross-section orthogonal to the length of the lens). For example, to collimate diverging beams 20, 22 emitted from the lasers 12a, 12b, a lens 25 having a focal length, f, can be placed a distance equal to the focal length, f, or thereabouts from the lasers 12 or laser bar 10. This lens 25 and arrangement may result in the collimation or at least increased collimation of the separate laser beams 20, 22 from the respective lasers 12a, 12b in the direction of the fast axis 18. (In some designs, lenslet arrays comprising respective lenslets for respective laser diodes may be used to collimate along the slow axis 16 direction.) This portion of the laser light source 100 configured to increase collimation of the light beam exiting the diode bar 10 at least in one direction (e.g., the direction of the fast axis 18) may be referred to as the collimation region. In the example shown in FIG. 1, the collimation region comprises collimation optics 25 comprising a lens.

Figure 2:
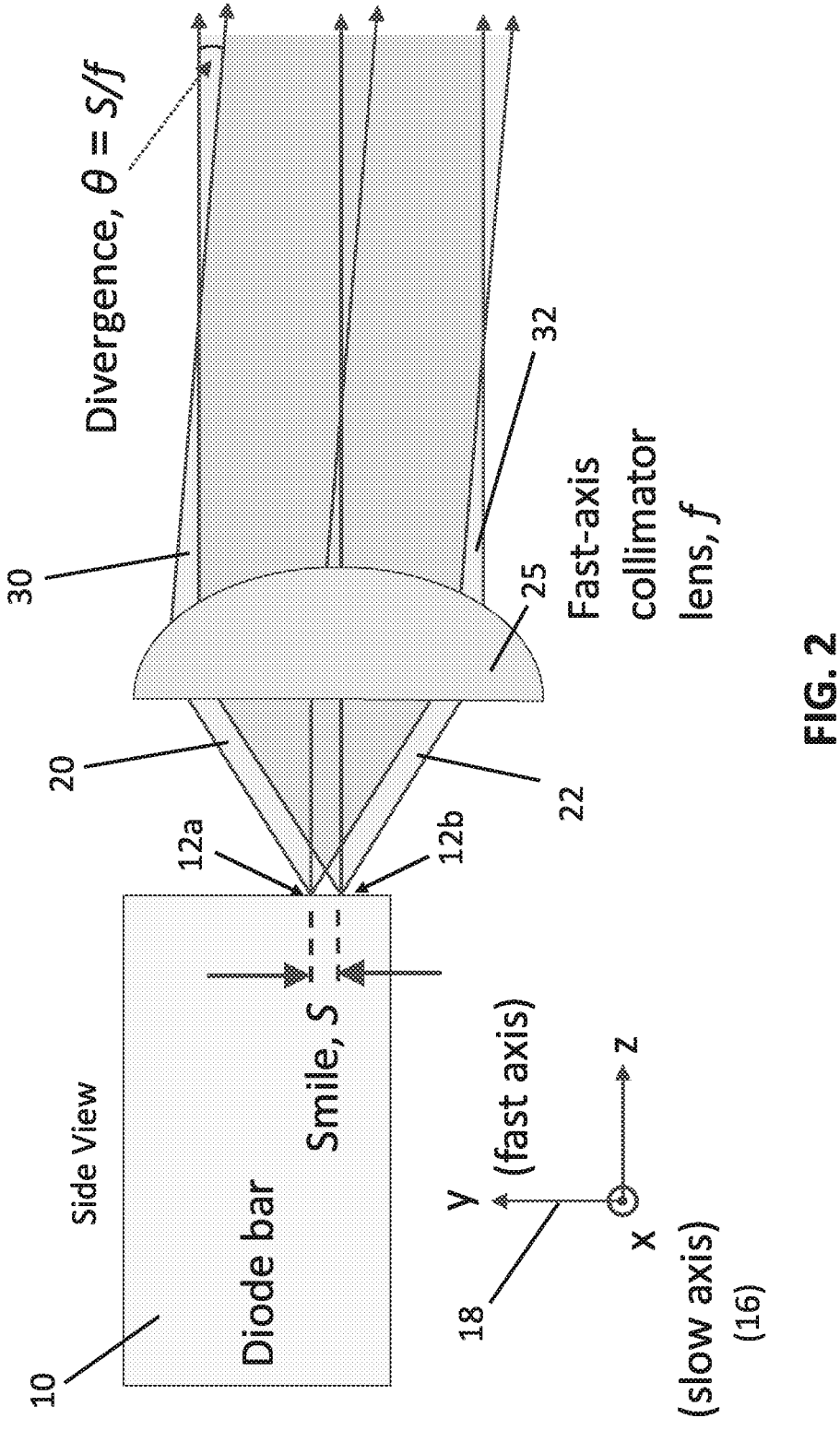
FIG. 2 is a side view illustrating light emitted from first and second semiconductor lasers in the array of lasers propagating though collimating optics. The vertical displacement of the first and second semiconductor laser diodes with respect to each other introduces mis-pointing of the individual beams and consequent divergence of the aggregate beam.

For illustrative purposes, first and second lasers 12a, 12b are shown in FIG. 2, which is a side view with the fast-axis 18 directed vertically. The lasers 12a, 12b may correspond, for example, to a laser 12a at the end 11 of the array 15 of laser diodes 12 and a laser 12b in the middle 13 of the array of laser diodes. FIGS. 2, which is a side view, shows the first and second laser 12a, 12b at different positions in the direction parallel to the fast axis or y-axis 18 as a result of the bar smile. In the example shown in FIG. 2, the difference in vertical positions, e.g., the distance in the vertical direction between the first and second lasers 12a, 12b is shown as the value, S.

Because the first and second lasers 12a, 12b are located in different vertical positions, the collimating optics 25 will direct the collected light 20, 22 for the respective first and second lasers into slightly different directions. Consequently, as shown in FIG. 2, bar smile causes emitters 12a, 12b to point the respective laser beams 30, 32 in different directions after collimation. This effect increases the envelope of the collimated bar divergence angle. Considering the plurality of beams 20, 22 output from the plurality of lasers emitters 12 in the array 15 of emitters 12, the aggregate or combined beam is not collimated but manifests a degree of spreading or divergence resulting from the light beams 30, 32 from the individual lasers 12a, 12b being directed toward slightly different directions by the collimating optics 25. FIG. 2 shows the divergence, θ, as the vertical distance, S, between the first and second lasers 12a, 12b divided by the focal length, f, of the collimating optics (e.g., θ=S/f). This divergence of the aggregate beam from the diode bar 10 or array 15 of lasers 12 can increase etendue and reduce diode bar brightness. For applications such as coupling to small core optical fibers, this brightness loss can be unacceptable and can greatly reduce fiber coupling efficiency and/or limit the minimum fiber size into which all emitters 12 can be efficiently coupled.

Figure 3:
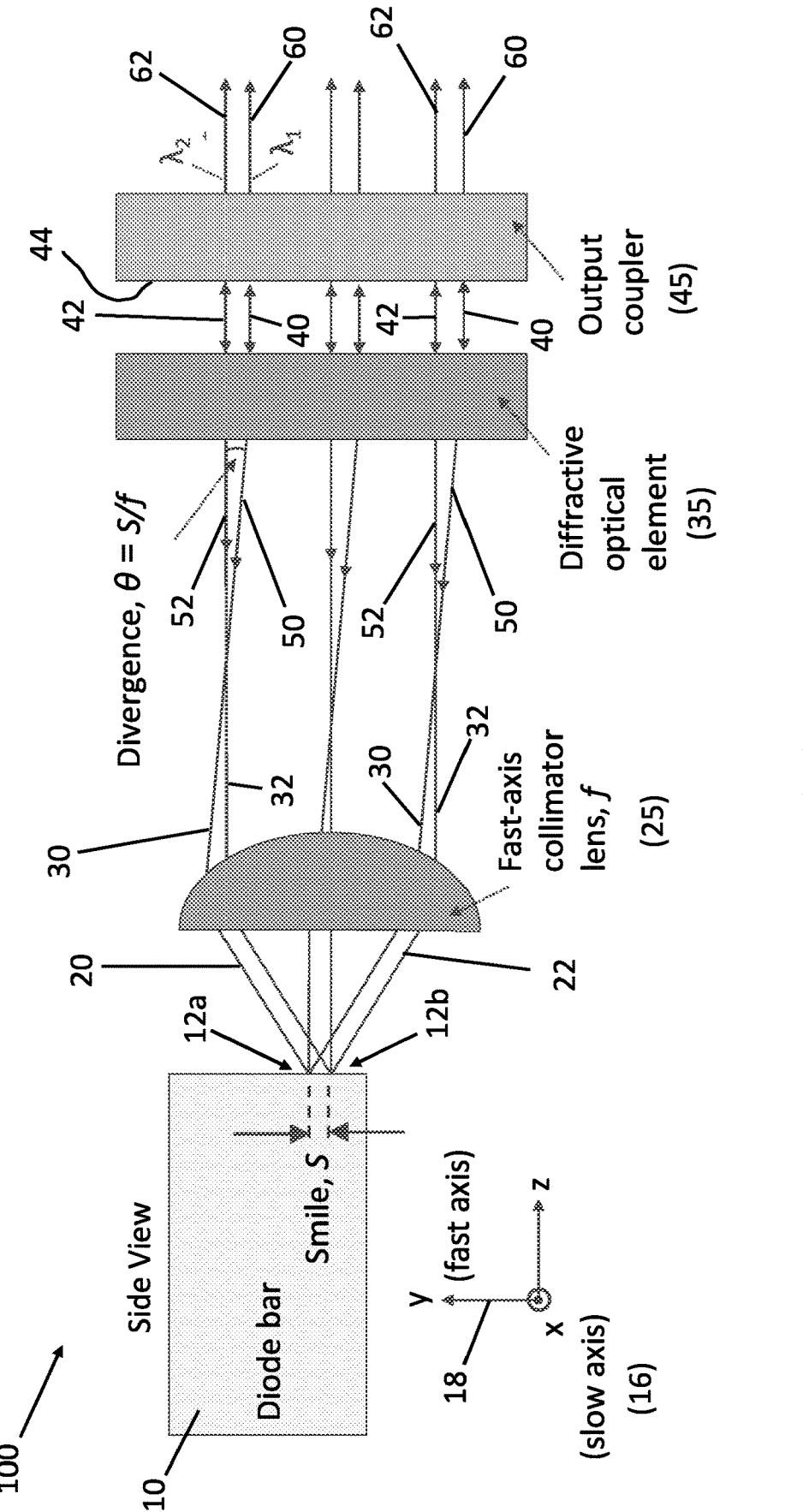
FIG. 3 is a side view illustrating light emitted from first and second semiconductor lasers in the array of lasers propagating laser light though a collimation region comprising collimating optics, a wavelength dispersive region comprising, for example, a diffractive optical element (DOE), and a partially transmissive, partially reflective reflector/output coupler having a partially transmissive, partially reflective surface. The dispersion region (e.g., DOE) has wavelength dispersion such that different wavelengths are distributed in different directions, e.g., diffracted by different amounts. The laser light source is designed such that the DOE will diffract different wavelengths having different angles of incidence so as to be normal to the partially reflective partially transmissive surface downstream of the DOE. Likewise, different wavelengths from different lasers located at different heights that are incident on the DOE at different angles will be retroreflected back to the respective lasers from which the light originated reducing the laser threshold for the individual semiconductor lasers to slightly different wavelengths. Moreover, most of the light transmitted by the partially transmissive reflector/output coupler comprises laser light normal to the reflector. The light from the array of lasers is, thus, more collimated.

Various designs described herein, may reduce or eliminate the divergence increase of the laser beam output a collimated diode bar due to smile. FIG. 3 depicts a schematic drawing of such a system 100. The laser light source 100 includes the diode bar 10 and collimating optics 25. As described above, the collimating optics or collimation region 25 may comprise an anamorphic, e.g., cylindrical, lens. The lens 25 may have optical power (e.g., refractive optical power or lens power) along one axis, such as along the direction parallel to the fast axis 18. As discussed above, the lens 25 may have a focal length, f, and may be positioned a distance equal to or about equal to the focal length f from the lasers 12, laser array 15, and/or laser bar 10. Thus, light from a laser emitter 12 can be collimated in at least one direct, for example, in the direction of the fast axis 18. Such optics 25 may be referred to as the fast axis collimating optics.

The optical system (light source) 100 further comprises a diffractive optical element (DOE) or dispersion region 35 positioned downstream of the collimating optics/collimation region 25 to receive light therefrom. The diffractive optical element/diffraction region 35 may comprise a volume DOE or a surface DOE. The diffractive optical element/diffraction region 35 may comprise a diffraction grating such as volumetric grating, and/or surface grating (e.g., surface grating.) The DOE has angular dispersion and causes light of different wavelengths to diffract different amounts, e.g., into different angles, directions, etc.

Figure 4:
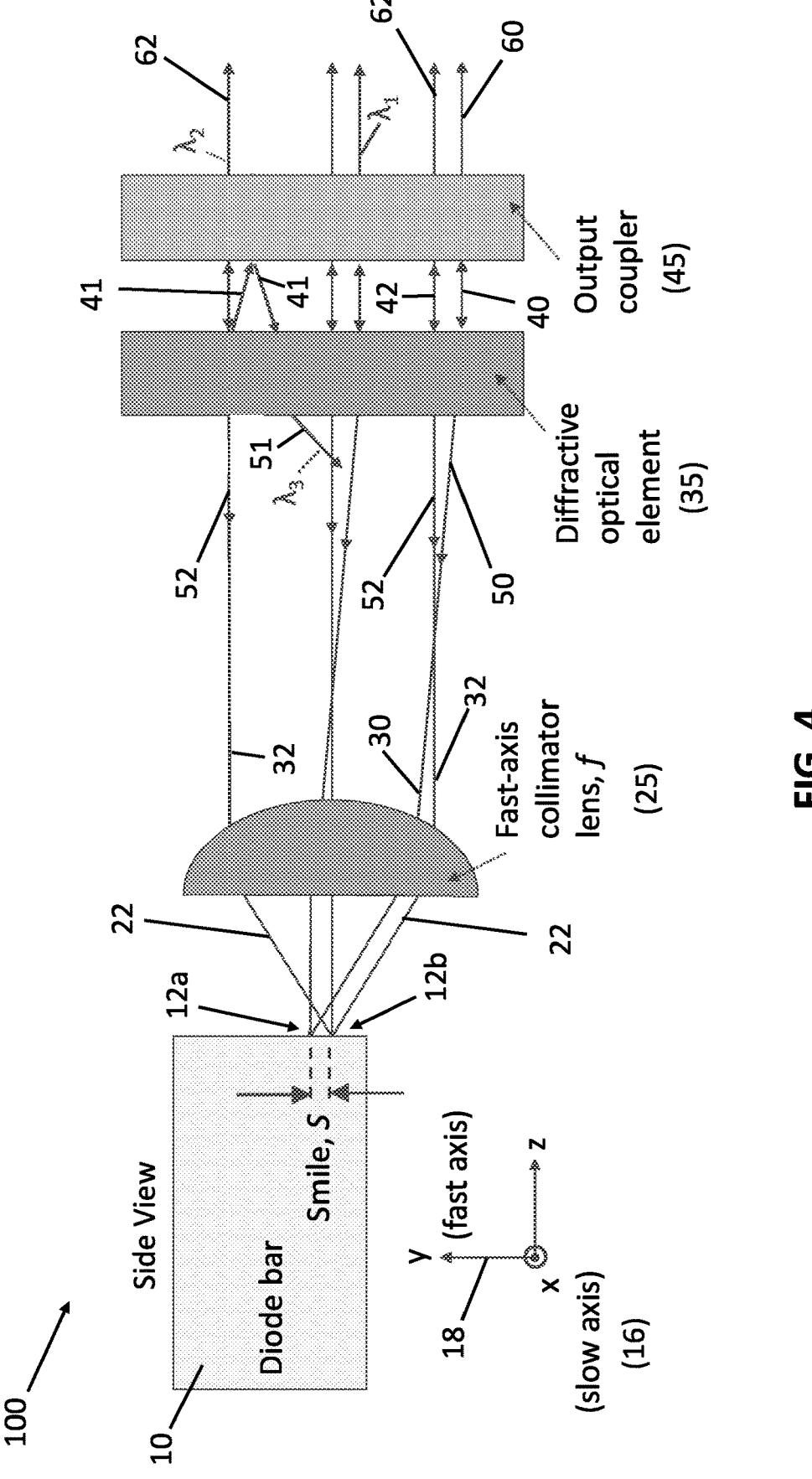
FIG. 4 is a side view illustrating light emitted from the first semiconductor laser having a wavelength ($\lambda_3$) that is directed (e.g., diffracted) such that the light is not normal to the reflective surface and does not retroreflect back into the first semiconductor laser such that the lasing threshold of the first semiconductor laser is not reduced for that wavelength, $\lambda_3$.

Although FIGS. 2-4 are discussed in terms of a diffractive optical element 35, other types of optical components that exhibit angular dispersion such as prisms maybe employed. A prism having wavelength dispersion will refract light of different wavelengths by different amounts such that, like a DOE, light incident on the prisms may propagate within and/or exit the prism at different angles. This light may thus propagate in different directions depending on the wavelength. This property generally results from the wavelength dispersion of the material comprising the prism. The prism, for example, may comprise material such as glass having an index of refraction that is different for different wavelengths, thus causing refraction to vary with wavelength. Likewise, the DOE shown in FIGS. 2-4 can be replaced with a prism or other optical element having sufficient angular dispersion where light of different angles is directed in different directions. Accordingly, the laser light source 100 is referred herein as having a dispersion region. This dispersion region may distribute light of different wavelengths into different directions and may comprise a DOE, prism or other optical element having dispersion. The configurations, however, may vary.

The light source 100 further comprises a partially reflective surface 44 on a partially transmissive reflector or outcoupling optical element 45 downstream of said DOE 35. The DOE 35 is in an optical path between the collimating optics 25 and the reflector 45. Likewise, the collimating optics 25 are in an optical path between the array 15 of lasers 12 or diode bar 10 and the DOE 35. The partially reflective surface 44 is also partially optically transmissive. A portion of the light incident on this surface 44 is reflected from the surface while a portion of the light is transmitted through the surface. In various implementations the range of effective reflectance of the output coupler 45 may be from less than 1% to up to 100%. The effective reflectance of the output coupler 45 is the absolute reflectance of the reflector multiplied by the fraction of light returning from it which is coupled back into the laser diode.

The DOE 35 and the reflector 45 cooperate in that wavelengths of light diffracted normal to the partially reflective surface 44 of the reflector 45 are retroreflected back to the DOE, the collimating optics 25 and the laser 12 from which the light emanated.

The lasers 12 may each output a narrow band of light including a plurality of wavelengths, e.g., $\lambda_1$, $\lambda_2$, $\lambda_3$, $\lambda_4$, $\lambda_5$, etc. which although close together and/or adjacent are distinct wavelengths. Furthermore, as discussed above, the different lasers 12a, 12b may be located at different positions, for example, in the direction orthogonal to direction in which the lasers span the diode bar 10. In the design shown in FIG. 1-3, for example, the different lasers 12a, 12b may be located at different positions in the vertical direction (e.g., in the direction of the fast axis 18). As such, light 30, 32 collimated by the collimating optics 25 will be incident on the DOE 35 at different angles as the collimated beams 30, 32 are directed at different angles. The laser light source 100 is designed, however, such that a different wavelength from each collimated beam 30, 32 will be diffracted such that the light is normal to the partially reflective surface 44 of the reflector/output coupler 45.

For example, FIG. 3 shows first and second lasers 12a, 12b emitting respective diverging beams of light 20, 22 that is received by the collimating optics 25. The collimating optics 35 collimate the respective beams of light 20, 22 incident thereon producing collimated beams 30, 32 that are directed at different angles and therefore incident on the DOE 35 at different angles of incidence because of the different heights at which the respective lasers are located. As discussed above, the DOE 35 includes angular dispersion which causes different wavelengths to be diffracted different amounts. The DOE 35 may be specifically designed to diffract light such that it is normally incident upon the partially reflective surface 44. Likewise, laser light 30 from the first laser 12a is incident on the DOE 35 at a first angle and the DOE is configured such that this light is diffracted a first amount to be directed normal to the partially reflective surface 44 of the reflector/output coupler 45, while laser light 32 from the second laser 12b is incident on the DOE at a second angle and the DOE is configured such that this light is transmitted through the DOE and normal to the reflective surface of the reflector 45. The DOE 35 may be designed such that two wavelengths, 21, 22, in the plurality of wavelengths, e.g., $\lambda_1$, $\lambda_2$, $\lambda_3$, $\lambda_4$, $\lambda_5$, etc. output by these respective lasers 12a, 12b will be diffracted by the appropriate amount to be incident on the partially reflective surface 44 of the reflector/output coupler 45 at an angle of zero degrees with respect to the normal to this surface (e.g., at normal incidence). For example, DOE 35 may be designed such the first wavelength, $\lambda_1$, will be diffracted by a suitable amount to redirect the beam of light 30 from the first laser 12a that is incident on the DOE at the first angle so as to be normally incident on the reflector/output coupler 45. Similarly, DOE 35 may be designed such the second wavelength, $\lambda_2$, will be diffracted by a suitable amount (or not diffracted) to direct or redirect the beam of light 32 from the second laser 12b that is incident on the DOE at the second angle so as to be normally incident on the reflector/output coupler 45. In the example illustrated in FIG. 3, the collimated beam 32 from the second laser 12b is normally incident on the DOE and thus does not need to be redirected by the DOE. Note that for clarity FIG. 3 only traces a couple of rays from each laser. Additional light rays could be traced, for example, from the second laser 12b. Additionally, light of different wavelengths may be output from the second laser 12b and, although not shown, may be diffracted in different directions by the DOE as a result of angular dispersion in the DOE. Similarly, additional light rays could be traced, for example, from the first laser 12a. Additionally, light of different wavelengths may be output from the first laser 12a and, although not shown, may be diffracted in different directions by the DOE as a result of angular dispersion in the DOE. However, other lasers 12 may be located at different vertical positions on the diode bar 10 and thus be incident on the DOE 35 at different angles and need to be redirected by different amounts, for example, by diffraction by the DOE or refraction by a prism or other similarly configure diffraction region. Likewise, different wavelengths, e.g., $\lambda_3$, $\lambda_4$, $\lambda_5$, etc., may be diffracted by the DOE 35 the appropriate amount so as to be normally incident on the partially reflective surface 44 of the reflector/coupler element 45.

In some examples, the DOE may be designed based a focal length of the collimating optics and a magnitude of the smile in the corresponding laser array. The magnitude of the smile ($S_m$) can be a height difference between two laser emitters of the laser array, having greatest height difference compared to other pairs of laser emitters. For example, with reference to FIG. 1, the magnitude of the smile ($S_m$) for the laser array 15 can be a height difference between the laser emitter 12a at an end of the laser array 15 and the laser emitter 12b in the middle of the laser array 15 (in this case $S_m$=S).

In some cases, a maximum divergence between the laser beams output by the laser array can be estimated as $\theta_m$=$S_m$/f, where f is the focal length of the collimating optics (e.g., collimator lens) 15. As such, in some implementations the DOE 35 is designed to diffract laser beams having wavelengths within a wavelength range supported by the laser emitters of the laser array 15 and incident on the DOE 35 within $\theta_m$ in a single direction. For example, when the DOE 35 is a diffraction grating, its groove spacing ($d_g$) may be determined based at least in part on $\theta_m$ and the wavelength range supported by the laser emitters. In some cases, when $\theta_m$ is small (e.g., smaller than 0.5 radians), $d_g$~$\Delta\lambda/\theta_m$.

In some examples, $S_m$ can be from 0.01 micron to 0.5 micron, from 0.5 micron to 1 micron, from 1 micron, from 1 micron to 5 microns, from 5 microns to 10 microns, 10 microns to 20 microns, 20 to 30 microns or any ranges formed by these values or can possibly be larger or smaller. In some examples, f can be from 0.1 mm to 0.5 mm, from 0.5 mm to 1 mm, from 1 mm to 5 mm, from 5 mm to 10 mm, or any ranges formed by these values or larger or smaller values. Accordingly in various implementations $\theta_m$ can be from $10^{-4}$ to 0.02, from 0.02 to 0.05, from 0.05 to 0.1, from 0.1 to 0.2, from 0.2 to 0.3 radian or any ranges formed by these values or possibly larger or smaller.

In some cases, the dispersion grating used as DOE 35 may have an amount of dispersion to diffract laser beams having wavelengths within a wavelength range of 0.05 nanometer (nm) or less, 1 nm or less, 5 nm or less, 10 nm or less, 20 nm or less, 30 nm or less, 40 nm or less, 50 nm or less, 100 nm or less, 300 nm or less, 500 nm or less, 700 nm or less, 900 nm or less, or any ranges formed by these values or possibly larger or smaller.

As an example, to compensate for a smile with $S_m$=10 microns, a diffraction grating (DOE 35) having a groove spacing of 1.6 microns (corresponding to 600lines per millimeter) and a collimating optics (fast-axis collimator lens 25) having a focal length of 500 microns may be used to diffract laser beams having wavelengths within a 32 nm bandwidth along a single direction such that they become normally incident on a reflective surface (e.g., reflective surface 44). Other designs are possible.

Once normally incident on the reflective surface 44 of the reflector 45, the diffracted beams 40, 42 will be retro-reflected back to the DOE 35 and be diffracted or transmitted (or possibly reflected if the DOE is a reflective DOE or grating) along the same path as the incoming light 30, 32 back to the respective laser emitters 12a, 12b. In this manner, the light source 100 is configured to direct different wavelengths $\lambda_1$, $\lambda_2$ back to different respective lasers 12. The respective laser 12a, 12b, by receiving feedback of a particular wavelength $\lambda_1$, $\lambda_2$, respectively, will have a reduced lasing threshold for those wavelengths. For example, as the combination of the DOE 35 and the reflector 45 will retro-reflect the first wavelength, $\lambda_1$, in the first laser beam 30, 40 incident on the DOE and reflector back through the collimating optics 25 and to the first laser 12a, and the laser feedback at the first wavelength $\lambda_1$ will reduced the lasing threshold of the first laser for the first wavelength, $\lambda_1$. Similarly, as the combination of the DOE 35 and the reflector 45 will retro-reflect the second wavelength, $\lambda_2$, in the second laser beam 32, 42 incident on the DOE and reflector back through the collimating optics to the second laser 12b, and the feedback at the second wavelength $\lambda_2$ will reduce the lasing threshold of the second laser for the second wavelength, $\lambda_2$. The dispersion region or DOE 35 may be configured such that other lasers at other vertical positions on the diode bar 10 will experience a similar effect such that different wavelengths will be retroreflected back to the different respective laser from which they originated, reducing the lasing threshold of those lasers for the respective wavelength returned to the laser.

Accordingly, the optical system (light source) 100 serves to retroreflect different wavelengths, e.g., $\lambda_1$, $\lambda_2$, $\lambda_3$, $\lambda_4$, $\lambda_5$, back to different respective lasers 12, reducing the laser threshold of those lasers for the wavelength of the laser feedback returned to them. This feedback will cause lasing at the wavelengths feedback to their the respective lasers to be more efficient. The lasers will more preferentially lase at these wavelength as opposed to other wavelengths in the respective laser cavities that do not receive such feedback. The lasers 12 will thus lase more strongly at these respective wavelengths, and these wavelengths will become the dominant wavelengths output by these lasers. The lasers become effectively locked to these respective center or peak wavelengths. Of course, the laser does not necessarily output a single wavelength but rather a narrow band of wavelength potentially having a center wavelength or peak wavelength corresponding, for example, to the wavelengths that are normally incident on the partially reflective partially transmissive surface and feed back to the respective lasers.

Moreover, because the reflective surface 44 is partially reflective and partially transmissive, a portion 60, 62 of the light 40, 42, that is normally incident on the partially reflective surface is transmitted therethrough at normal incident thereby producing an output beam coupled through the output coupler 45 formed by the plurality of beams from the respective lasers 12a, 12b propagating along a common angle that is normal to the reflective surface 44. The collimation of the beam exiting the system is thereby increased as the respective collimated beams 60, 62 from the different lasers that were previously pointing at different angles are now each propagating at a similar angle, e.g., normal to the partially reflective surface 44 of the partially reflective partially transmissive reflector 45. Increased collimation of the light from the plurality of lasers 12a, 12b is therefore obtained.

As discussed above and shown in FIGS. 2, the DOE 35 receives collimated light from different lasers 12 such as from the first and second lasers 12a, 12b, however, the light from the different lasers is pointed in different directions due to the differences in spatial location, for example, the different in the height of the different emitters as a result of smile. The differently pointed collimated beams 30, 32 from the individual lasers cause the aggregate beam to be diverging and less collimated. In contrast, the addition of the DOE 35 and partial reflector/output coupler 45, appropriately designed as described herein, may output primarily light that is normal to the partially reflective partially transmissive surface of the reflector/output coupler, which because this light is directed largely in the same direction (e.g., normal to the partially reflective surface), will be more collimated. In this system 100, the diffractive optical element 35 diffracts the plurality of wavelengths in a laser 12 into different angles based on the dispersion of the DOE. The magnitude of this conversion, corresponds to the grating dispersion, which can be expressed as a ratio ($\Delta\theta/\Delta\lambda$).

Perfectly collimated (zero divergence) light entering a diffractive optical element will leave the element at a range of angles dictated by 1) the range of wavelengths output by the laser and 2) the dispersion of the diffractive optical element. In various designs, one of these wavelengths is selected by the system 100, the wavelength that is provided for normal incidence on the partially reflective surface 44 and retroreflected back to the lasers 12. Further, the laser light source 100 may be configured such that other wavelengths do not follow the same path back to the laser 12 from which the light originated as illustrated in FIG. 4. FIG. 4, for example shows a light 22, 32 from the second laser 12b collimated by the collimating optics 25 and incident on the DOE 35. FIG. 4 additionally shows that the DOE 35 is configured such that light having a third wavelength, $\lambda_3$, is diffracted at an angle by the DOE such that this light 41 is not normally incident on the partially reflective surface 44. Likewise, this light 41 is not retroreflected off the partially reflective surface 44 but instead is reflected off the partially reflective surface at a non-zero angle. This reflected light 41 is diffracted by the DOE 35 again or possibly not diffracted by the DOE, such that the light 51 transmitted through the DOE is not retroreflected back to the second laser 12b from which it originated. Likewise, light from the second laser 12b having of the third wavelength, $\lambda_3$, does not provide feedback to the second laser such that the lasing threshold of the third laser is reduced for this third wavelength, $\lambda_3$. Note that for clarity FIG. 4 only traces a couple of rays from each laser. Additional light rays could be traced, for example, from the first laser 12b. Additionally, light of different wavelengths may be output from the first laser 12b and, although not shown, may be diffracted in different directions by the DOE as a result of angular dispersion in the DOE. Similarly, additional light rays could be traced, for example, from the second laser 12b. Additionally, light of different wavelengths may be output from the second laser 12b and, although not shown, may be diffracted in different directions by the DOE as a result of angular dispersion in the DOE.

As discussed above, this process whereby light of a particular wavelength, e.g., $\lambda_1$, that is normally incident on the partially reflective surface 44 is feedback to the laser 12a reducing the laser threshold for this wavelength, $\lambda_1$, causes this wavelength, $\lambda_1$, to laser more efficiently and to be the dominant wavelength to lase and be output by the laser 12a. The lasers will more preferentially lase at these wavelength as opposed to other wavelengths in the respective laser cavities that do not receive such feedback. The lasing of these wavelengths will thus become stronger and these wavelengths will be the dominant wavelengths for those lasers. The lasers become effectively locked to these respective center or peak wavelengths. Of course, the laser does not necessarily output a single wavelength but rather a narrow band of wavelength potentially having a center wavelength or peak wavelength corresponding, for example, to the wavelengths that are normally incident on the partially reflective partially transmissive surface and feed back to the respective lasers.

As described, this wavelength, $\lambda_1$, will be incident on the partially reflective surface 44 at normal incidence and a portion of this light will be transmitted through the partially reflective partially transmissive surface at normal incidence. Consequently, the various respective wavelengths, $\lambda_1$, $\lambda_2$, from the respective lasers 12a, 12b will be transmitted through the partially reflective, partially transmissive surface 44 normal with respect to the partially reflective surface. These wavelengths will also correspond to the wavelengths that dominate lasing in the respective lasers 12a. 12b and are output by the respective lasers. As the light from individual lasers such as the first and second lasers is now output generally normal to the partially reflective partially transmissive surface and thus in generally the same direction. Likewise, the laser light output by the output coupler is more collimated than the laser light received by the diffractive optical element. As discussed above and shown in FIGS. 2, the DOE receives collimated light from different lasers such as from the first and second lasers, however, the light from the different lasers is pointed in different directions due to the differences in spatial location, for example, the different in the height of the different emitters as a result of smile. The differently pointed collimated beams from the individual lasers cause the aggregate beam to be diverging and less collimated. In contrast, the addition of the DOE and partial reflector/output coupler, appropriately designed as described herein, may output primarily light that is normal to the partially reflective partially transmissive surface of the reflector/output coupler, which because this light is directed largely in the same direction (e.g., normal to the partially reflective surface), will be more collimated. In this manner, collimation will be increased as the various wavelengths $\lambda_1$, $\lambda_2$, $\lambda_3$, $\lambda_4$, $\lambda_5$, etc. will exit the light source 100 generally normal with respect to the partially reflective surface 44. Once again, these wavelengths will also correspond to the wavelengths that dominate lasing in the respective laser 12a, 12b from which they originate and are the prominent wavelengths output by the respective lasers. Accordingly, most of the light output by the plurality of the lasers 12 in the laser array 15 of the diode bar 10 will correspond to the dominant wavelengths from the respective lasers that will also be normal to the partially reflective surface. With most of the light output from the plurality of the lasers 12 being directed in a similar direction, the light transmitted by the reflector 45, which is also referred to herein as an output coupler, will be more collimated than the light collimated solely with the collimating lens 25.

Advantageously, this approach enables increased collimation of diode bars 10 exhibiting smile. As discussed above, as a result of laser bar smile, which shifts the vertical position of laser diodes 12 in the array 15 with respect to each other, a simple collimating lens 25 will cause different collimated beams 30, 32 to be pointed in different directions thereby increasing beam aggregate divergence. The addition of the diffractive optical element 35 and the partially reflective surface 44 as shown in FIGS. 1-3, however, serves to lock different emitters to different respective wavelengths, which are related to the grating input angle (and hence vertical position of that emitter). Different emitters are locked to the precise wavelength for the diffractive optical element 35 to precisely correct the collimated mis-pointing arising from a non-zero smile by enhancing laser output of the wavelength that correspond to a narrow angular range, e.g., normal to the reflective surface 44 and output coupler 45. In this manner, the laser emission output after the output coupler 45 is expected to have reduced divergence and in the limit may approach the expected value achieved for a comparable bar with zero smile. This approach has the added benefit of stabilizing the emission spectrum of the diode laser array 15 in a manner similar to spectral locking thereby making the diode bar much less sensitive to changes in junction temperature.

In order to maintain high power, high efficiency operation of the diode laser bar 10, the optical losses between the diode bar and output coupler 45 may be reduced. Sources of losses include: 1) diffraction losses arising from imperfect collimation in the fast-and slow-axis direction, techniques for improving of which are discussed above, as well as 2) Fresnel reflection losses arising from the optical surfaces between the laser output facet and output coupler 45. Techniques which integrate functionality of the various elements, for example, of the collimation region 25, the dispersion region 35, and the partially reflective reflector/output coupler 45 into fewer numbers of discrete components can be advantageous for reducing Fresnel reflection losses. Examples include: (1) integrating the diffractive optical element 35 with the fast-axis collimating lens 25 (e.g., shown in FIG. 5), (2) integrating the partially reflective reflector/output coupler 45 with the diffractive optical element 35 (e.g., shown in FIGS. 6), and (3) integrating the collimating optics 25, diffractive optical element 35, and the partially reflective reflector/output coupler 45 together (e.g., shown in FIG. 7).

Figure 5:
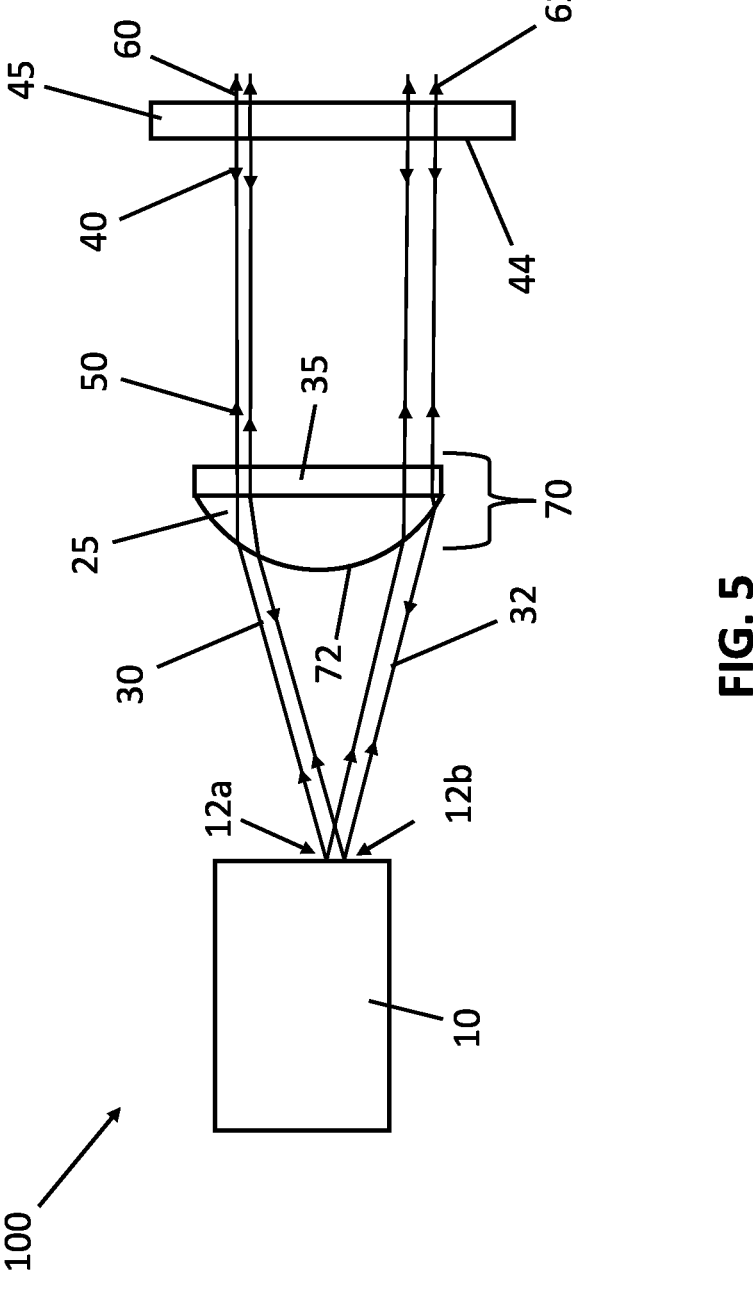
FIG. 5 is a schematic view of a laser light source wherein the collimation region and the wavelength dispersion region are included in a single optical element thereby potentially reducing loss produced by Fresnel reflection.

As referenced above, FIG. 5 shows a laser light source 100 such as described herein wherein the collimation region 25 is integrated with the dispersion region 35 in the same optical element. In the example shown, an optical element 70 includes a curved surface 72 on a front side thereof that provides optical power (e.g., refractive optical power or lens power) to collimate light as well as a diffractive optical element 35 on the back side thereof. The curved surface 72 may be anamorphic, for example, cylindrical or acylindrical, to collimate light in one direction, for example, along the fast axis 18. Integration of the collimation region 25 and the dispersion region 35 into a single optical component reduces the number of interfaces such as air/glass or air/polymer interfaces that may produce Fresnel reflection and introduce optical loss. Other possible designs for the optical component 70 are possible.

Figure 6:
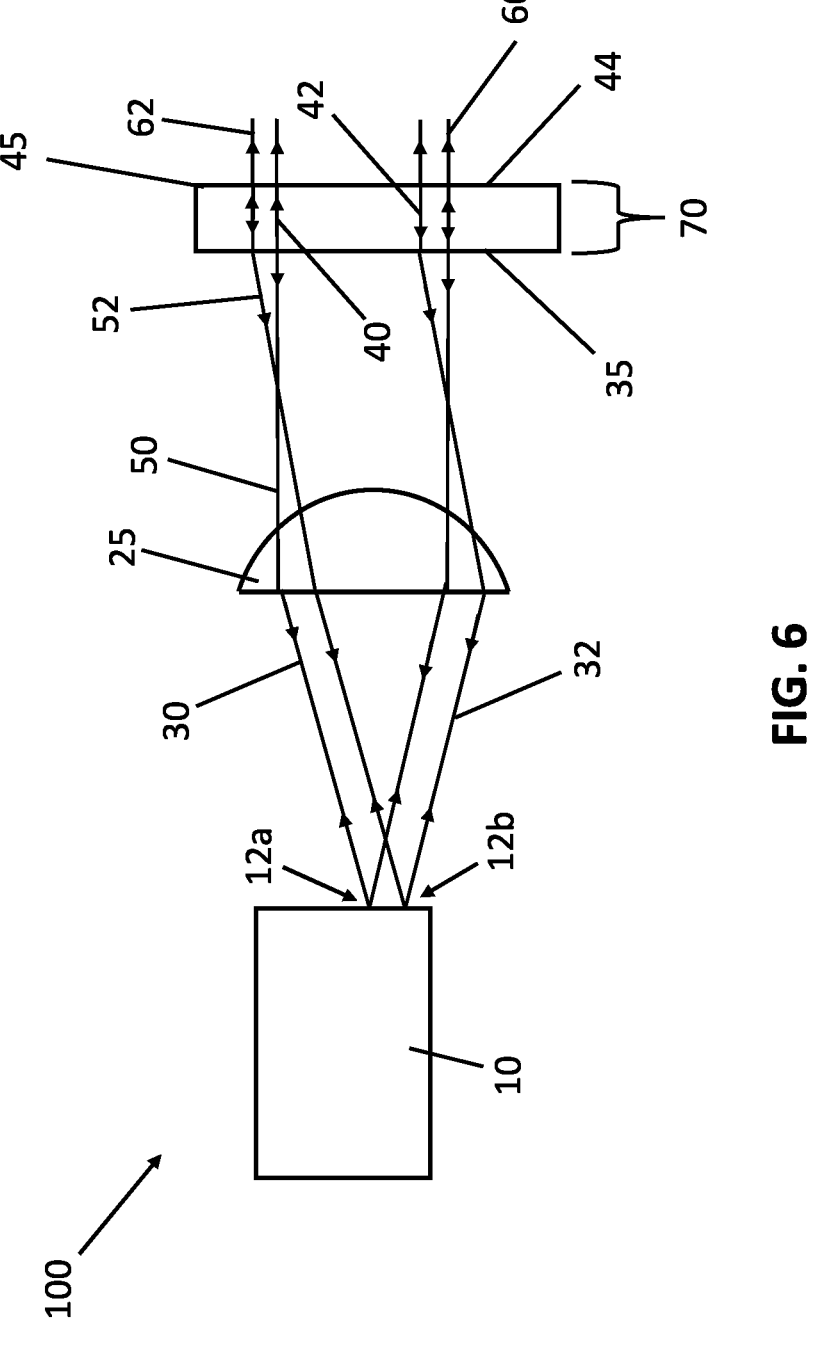
FIG. 6 is a schematic view of a laser light source wherein the wavelength dispersion region and the partially reflective partially transmissive surface are integrated into a single optical element thereby potentially reducing loss produced by Fresnel reflection.

FIG. 6 shows another laser light source 100 such as described herein wherein the dispersion region 35 is integrated with the partially reflective, partially optically transmissive reflector 45 in the same optical element. In the example shown, an optical element 80 includes a diffractive optical element 35 on a front side thereof as well as a partially reflective partially transmissive surface 44 on the back side thereof. Integration of the dispersion region 25 and the reflector-output coupler 45 into a single optical component reduces the number of interfaces such as air/glass or air/polymer interfaces that may produce Fresnel reflection and introduce optical loss. Other possible designs for the optical component 80 are possible.

Figure 7:
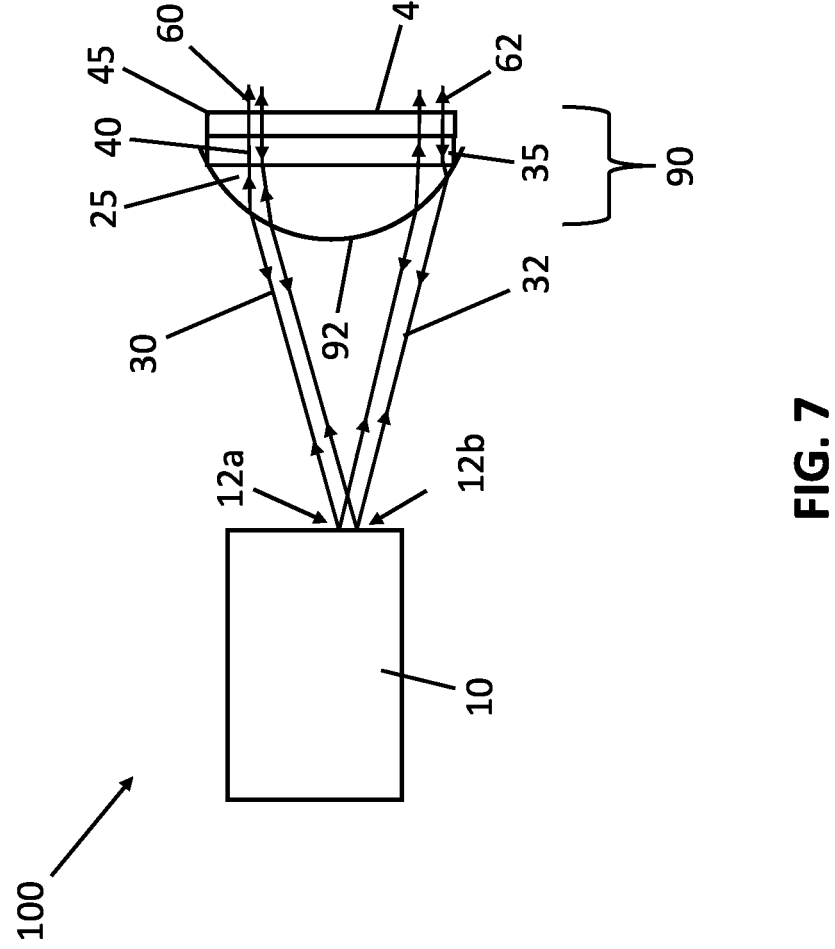
FIG. 7 is a schematic view of a laser light source wherein the collimation region, the wavelength dispersion region and the partially reflective partially transmissive surface are integrated into a single optical element thereby potentially reducing loss produced by Fresnel reflection.

FIG. 7 shows another laser light source 100 such as described herein wherein the collimation region 25, dispersion region 35, and partially reflective, partially optically transmissive reflector 45 are integrated together in the same optical element. In the example shown, an optical element 90, e.g., one discrete optic, includes a curved surface 92 on a front side thereof that provides optical power (e.g., refractive optical power or lens power) to collimate light and a partially reflective partially transmissive surface 44 on the back side thereof. A diffractive optical element 35 is included between the collimation region 25 and the reflector/output coupler 45. Integration of the collimation region 25, dispersion region 35 and the reflector/output coupler 45 into a single optical component 90 reduces the number of interfaces such as air/glass or air/polymer interfaces that may produce Fresnel reflection and introduce optical loss. Other possible designs for the optical component 90 are possible.

Figure 8:
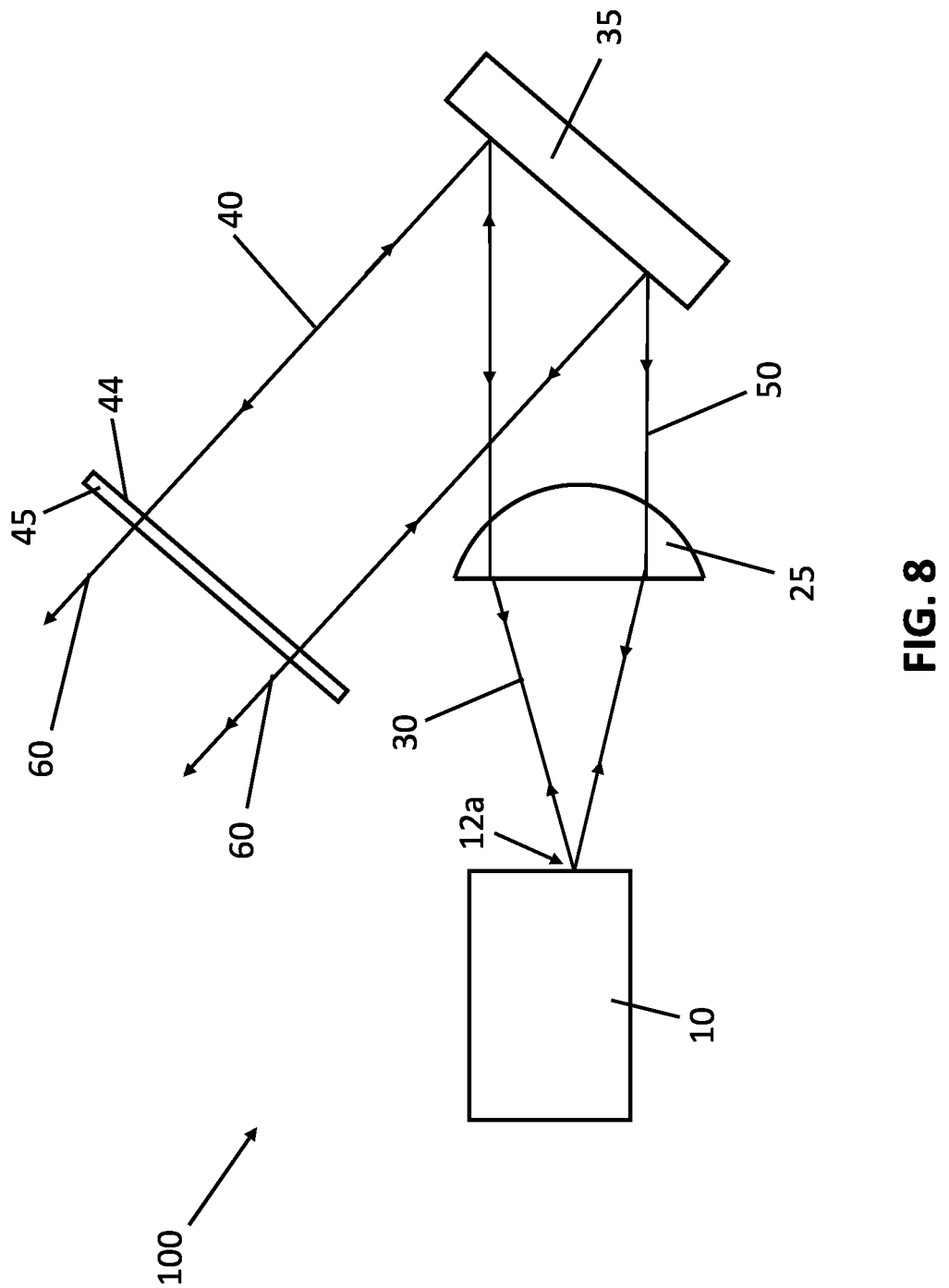
FIG. 8 is a schematic view of a laser light source wherein the wavelength dispersion region comprises a reflective diffractive optical element that diffracts light reflected therefrom into different directions depending on the wavelength of the incident laser light.

Other configurations and designs of the laser light source 100 are possible. For example, the dispersion region 35 may be reflective. For instance, the dispersion region 35 may comprise a reflective diffractive optical element that diffracts light reflected therefrom. Such a configuration is shown in FIG. 8. The reflective diffractive optical element 35 is disposed in the optical path between the collimation region 25 comprising the fast axis collimating lens and the reflector/output coupler 45 that includes a partially reflective, partially transmissive surface 44. Light from the lasers 12 is transmitted through the collimating lens 25 and incident on the reflective diffractive optical element 35. The reflective DOE 35 reflects the light incident thereon diffracting the reflected light such as describe herein. For example, certain wavelengths from the laser emitters 12 are diffracted so as to be normally incident on the partially reflective surface 44 of the reflector/output coupler. This light that is normally incident on the partially reflective surface 44 will retroreflect backward to the reflective DOE 35, the collimating lens 25 and the respective laser 12 from which the light originated as discussed above. Some of the light normally incident on the reflector/output coupler 45 is transmitted through the reflector/output coupler and output as collimated light 60 as shown.

Still other variations and configurations for the laser light source 10 are possible. For example, one or more intermediate relays may be included in the optical path of the light beams.

Various approaches described herein enable precise emitter-by-emitter smile correction without the need of individual custom optics for each individual emitter such as custom optical phase plates that individually repoint the output beam each emitter of the diode bar. There does exist a relationship between the total emission bandwidth of the light source 100 and total bar smile. More bar smile can translate to a wider spectral bandwidth of the laser light source 100. However, because the divergence of the diffractive optical element or dispersion region 35 can be engineered, the emission bandwidth can be reduced for a given amount of bar smile. In principle, a dispersion region 35 having a large amount of angular dispersion, e.g., a high dispersion grating, could be used to make the spectral bandwidth of the collimated laser bar arbitrarily narrow.

In various implementations, to increase the locking effect and stabilize the laser wavelength such that the dispersion region (e.g., diffractive optical element or prism) 35 and output coupler 45 is able to correct smile, a broadband feedback to a diode laser (e.g., laser cavity of the laser) provided by an output facet of the laser, may be reduced compared to the effective reflectance of the output coupler. As discussed above, the effective reflectance of the output coupler 45 is the absolute reflectance of that reflector/output coupler multiplied by the fraction of light returning from the reflector that is coupled back into the laser diode 12. For example, the reflectance of the output facet of the diode laser may be reduced to a value of 5% or lower (including all the way down to 0%). The overall slope efficiency (and hence efficiency/power penalty associated with this approach) is affected by the strength of the output coupler 45; generally, weaker effective reflectance values (such as 20% or less or 10% or less) are desirable for higher slope efficiency. Thus, solutions that reduce the laser diode facet reflectance to 5% or below, reduce Fresnel reflections between the diode laser and output coupler, and/or reduce the output coupler effective reflectance values are expected to yield the beneficial combination of locking characteristics (and hence smile correction) and high output power and efficiency.

Techniques which increase the degree of collimation between the fast axis collimator 25 and output coupler 45 may also be advantageous. For example, a slow-axis collimating lens array may be introduced between collimation region (e.g., the fast axis collimator) 25 and dispersion region (e.g., the diffractive optical element) 35. In some examples, the slow-axis collimating lens array may have a longer focal length compared to the fast-axis collimating lens array.

Advantageously, various implementations may reduce or eliminate the increased far-field divergence envelope of a collimated diode laser bar 10 (in the fast-axis or growth direction) that arises due to bar smile. As discussed above, excess divergence caused by laser diode bar smile limits the maximum brightness of diode modules. For applications such diode pumped fiber lasers, bar smile limits the power and electrical-to-optical conversion efficiency of the fiber-coupled module.

The spectrum-based smile compensation method disclosed herein to precisely compensate smile of individual emitters 12 in the laser diode bar 10 offers numerous benefits. Various designs include only one or two additional components (e.g., the diffractive optical element 35 and partial reflector/output coupler 45). As discussed above, two or more of the collimating optics 25, dispersion region 35, and partial reflector/output coupler 45 can be integrated into the same optical component. The approach also has the added benefit of stabilizing the wavelength of laser diode bar 10. Thermal variations in the laser diode bar junction temperature are not expected to change the laser emission wavelength.

Accordingly, various designs described herein offer a low cost approach to exactly compensating for a wide range, if not possibly any amount of bar smile. Inherent wavelength stabilization is also provided in open-loop manner. Furthermore, this bar smile solution for diode bars 10 may be compatible with various spectral beam combining methods.

EXAMPLES

Example embodiments described herein have several features, no single one of which is indispensable or solely responsible for their desirable attributes. A variety of example systems and methods are provided below.

Group I

Example 1: A laser light source comprising:
  a semiconductor laser array comprising a plurality of semiconductor lasers arranged along a first direction axis, at least some of said semiconductor lasers also having different positions along a second direction orthogonal to said first direction, said plurality of semiconductor lasers including first and second semiconductor lasers having different positions both along said first and second directions, said first and second semiconductor lasers outputting diverging beams of laser light having a bandwidth that includes a plurality of wavelengths;
  a collimation region disposed to receive said laser light from said first and second semiconductor lasers and configured to transmit laser light from said first and second semiconductor lasers that is more collimated;
  a dispersion region having angular dispersion disposed to receive light from said first and second lasers that is transmitted through said collimation region, said dispersion region configured to distribute different wavelengths of said plurality of wavelengths in different directions; and
  a reflective surface that is partially reflective and partially transmissive positioned to receive said different wavelengths from said dispersion region and reflect a portion of said light back to said dispersion region,
  wherein at least a portion of light from said first semiconductor laser having a first wavelength is incident on said dispersion region and transmitted through or reflected from said dispersion region so as to be normal to said reflective surface such that at least some of said light is retroreflected back to said dispersion region, onto said collimation region and to said first semiconductor laser,
  wherein at least a portion of light from said second semiconductor laser having a second wavelength different than the first wavelength is incident on said dispersion region at a angle and transmitted through or reflected form said dispersion region and re-directed so as to be normal to said reflective surface such that at least some of said light is retroreflected back to said dispersion region, onto said collimation region and to said second semiconductor laser, and
  wherein at least a portion of said light from said first and second semiconductor lasers is transmitted through said reflective surface at normal incidence to said reflective surface such that light from said first and second lasers transmitted through said reflective surface is more parallel to each other than light from said first and second lasers incident on said dispersion region and is thus light from said semiconductor array is more collimated upon output from said laser light source.

Example 2: The laser light source of Example 1, wherein said semiconductor laser array comprises a diode bar.

Example 3: The laser light source of Example 2, wherein said diode bar exhibits smile.

Example 4: The light source of any of Examples 1 or 2, wherein said first direction is horizontal and said second direction is vertical and semiconductor lasers are arranged along an arcuate path with semiconductors lasers more central in said arcuate path of said array lower than semiconductor lasers at the ends of said array or with semiconductors lasers more central in said array higher than semiconductor lasers at the ends of said array.

Example 5: The laser light source of any of the examples above, wherein said semiconductor lasers comprise waveguide lasers having a waveguide with a length and a cross-section orthogonal to said length, said cross-section wider than high such that said semiconductor lasers have a fast axis and a slow axis orthogonal to said fast axis, said slow axis along said first direction and said fast axis along said second direction.

Example 6: The laser light source of Example 5, wherein said cross-section orthogonal to said length is rectangular.

Example 7: The laser light source of any of the examples above, wherein said collimation region has different lens power along said first direction as compared to along said second direction.

Example 8: The light source of Example 7, wherein said collimation region has more lens power along said second direction as compared said first direction.

Example 9: The laser light source of any of the examples above, wherein said collimation region has a focal length and is positioned a focal length away from said plurality of semiconductor lasers to increase collimation of the diverging laser light beams emitted by the semiconductor lasers.

Example 10: The laser light source of any of the examples above, wherein said collimation region comprises one or more lenses.

Example 11: The laser light source of Examples 10, wherein said lens comprises at least one cylindrical or acylindrical lens.

Example 12: The laser light source of any of the examples above, wherein said collimation region comprises at least one anamorphic surface.

Example 13: The laser light source of any of the examples above, wherein said collimation region comprises at least one cylindrical or acylindrical surface.

Example 14: The laser light source of any of the examples above, wherein said dispersion region comprises a diffractive optical element.

Example 15: The laser light source of any of the examples above, wherein said dispersion region comprises diffraction grating.

Example 16: The laser light source of any of the examples above, wherein said dispersion region comprises a transmissive diffractive optical element configured to diffract transmitted light.

Example 17: The laser light source of any of the examples above, wherein said dispersion region comprises a reflective diffractive optical element configured to diffract reflected light.

Example 18: The laser light source of any of Examples 1-13, wherein said dispersion region comprises a prism configure to refract light, said refraction being wavelength dependent.

Example 19: The laser light source of any of the examples above, wherein said dispersion region and said reflective surface are integrated together in the same optical element.

Example 20: The laser light source of any of Examples 19, wherein said optical element comprises an optically transmissive medium including a diffractive optical element on one side and said reflective surface on another side.

Example 21: The laser light source of Example 19, wherein said optical element comprises an optically transmissive medium including a diffractive optical element disposed on a first surface of said optical element and said reflective surface comprises a second surface of said optical element.

Example 22: The laser light source of Example 19, wherein said optical element comprises an optically transmissive medium having a first surface configured to refract laser light from the laser array, and said reflective surface comprises a second surface of said optically transmissive medium.

Example 23: The laser light source of Examples 19 or 22, wherein said dispersion region comprises prism having a first surface configured to refract laser light from the laser array, and said reflective surface comprises a second surface of said prism.

Example 24: The laser light source of any of the claims above, wherein said collimation region and said dispersion region are integrated together on the same optical element.

Example 25: The laser light source of Example 24, wherein said optical element comprises an optically transmissive medium having a lens surface on one side and a diffractive optical element on another side.

Example 26: The laser light source of Example 24 or 25, wherein said optical element comprises a lens having a surface with optical power on one side and a diffractive optical element on another side.

Example 27: The laser light source of any of the claims above, wherein said collimation region, said diffractive region, and said reflective surface are integrated together on the same optical element.

Example 28: The laser light source of Example 27, wherein said optical element comprises an optically transmissive medium having a lens surface and a diffractive optical element, and said reflective surface comprises another surface of said optically transmissive medium.

Example 29: The laser light source of Example 27, wherein said optical element comprises an optically transmissive medium having a lens surface on a first surface, and said reflective surface comprises a second surface of said optically transmissive medium.

Example 30: The laser light source of any of the examples above, wherein light from said plurality of semiconductor lasers that is transmitted through said reflective surface is more collimated than light from said plurality of semiconductor lasers that is incident on said dispersion region to be directed toward said reflective surface.

Example 31: The laser light source of any of the examples above, wherein said light from said first and second semiconductor lasers that is transmitted through said reflective surface is more collimated than said light from said first and second semiconductor lasers that is incident on said dispersion region to be directed toward said reflective surface.

Example 32: The laser light source of any of the examples above, wherein said reflective surface has a reflectivity from 10% to 99%.

Example 33: The laser light source of any of the examples above, wherein said first and second laser semiconductor lasers have output facets having an anti-reflective coating thereon.

Example 34: The laser light source of any of the examples above, wherein said semiconductor lasers have fast and slow axes, said first direction parallel to the slow axis of said semiconductor lasers and said second direction parallel to the fast axis of said semiconductor lasers.

Example 35: The laser light source of any of the examples above, wherein said dispersion region has an amount of dispersion such that laser light transmitted through said reflective surface have wavelengths within a range of less than 32 nm nanometers.

Example 36: The laser light source of any of the examples above, wherein said plurality of semiconductor lasers comprises at least three semiconductor lasers.

Example 37: The laser light source of any of the examples above, wherein said retroreflecting at least some of said light from said first laser back to said dispersion region, onto said collimation region and to said first semiconductor laser lowers the laser threshold of said first semiconductor laser for said first wavelength.

Example 38: The laser light source of any of the examples above, wherein said retroreflecting at least some of said light from said second laser back to said dispersion region, onto said collimation region and to said second semiconductor laser lowers the laser threshold of said second semiconductor laser for said second wavelength.

Example 39: The laser light source of any of the examples above, wherein said plurality of semiconductor lasers comprises a third semiconductor laser having a different position both along said first and second directions than said first and second semiconductor lasers, said third semiconductor laser configured to output a diverging beam of laser light having a bandwidth that includes a plurality of wavelengths.

Example 40: The laser light source of Examples 39, wherein said collimation region is disposed to receive said laser light from said third semiconductor laser and configured to transmit light from said third semiconductor laser that is more collimated.

Example 41: The laser light source of Example 38, wherein a portion of the light from said third semiconductor laser having a third wavelength is incident on said dispersion region at an angle and is transmitted through or reflected from said dispersion region at an angle so as to be normal to said reflective surface such that at least some of said light is retroreflected back to said dispersion region, onto said collimation region and to said third semiconductor laser.

Example 42: The laser light source of Example 41, wherein said retroreflecting at least some of said light from said third laser back to said dispersion region, onto said collimation region and to said third semiconductor laser lowers the laser threshold of said third semiconductor laser for said third wavelength.

Example 43: The laser light source of any of the examples above, wherein said dispersion region is configured such that said first and second wavelengths if emitted by said third semiconductor laser and incident on said dispersion region would not be transmitted through or reflected from said dispersion region so as to be normal to said reflective surface and retroreflected back to said dispersion region, said collimation region, and said third semiconductor laser.

Example 44: The laser light source of any of the examples above, wherein said dispersion region is configured such that said first wavelengths if emitted by said second semiconductor laser and incident on said dispersion region would not be transmitted through or reflected from said dispersion region so as to be normal to said reflective surface and be retroreflected back to said dispersion region, said collimation region, and said second semiconductor laser.

Example 45: The laser light source of any of the examples above, wherein said dispersion region is configured such that said second wavelengths if emitted by said first semiconductor laser and incident on said dispersion region would not be transmitted through or reflected from said dispersion region so as to be normal to said reflective surface and retroreflected back to said dispersion region, said collimation region, and said first semiconductor laser.

Group II-Diffractive Optical Element

Example 1: A laser light source comprising:

a semiconductor laser array comprising a plurality of semiconductor lasers arranged along a first direction axis, at least some of said semiconductor lasers also having different positions along a second direction orthogonal to said first direction, said plurality of semiconductor lasers including first and second semiconductor lasers having different positions both along said first and second directions, said first and second semiconductor lasers outputting diverging beams of laser light having a bandwidth that includes a plurality of wavelengths;

collimating optics disposed to receive said laser light from said first and second semiconductor lasers and configured to transmit laser light from said first and second semiconductor lasers that is more collimated;

a diffractive optical element having angular dispersion disposed to receive light from said first and second lasers that is transmitted through said collimating optics, said diffractive optical element configured to diffract different wavelengths of said plurality of wavelengths in different directions; and a reflective surface that is partially reflective and partially transmissive positioned to receive said different wavelengths from said diffractive optical element and reflect a portion of said light back to said diffractive optical element, wherein at least a portion of light from said first semiconductor laser having a first wavelength is incident on said diffractive optical element and diffracted by said diffractive optical element so as to be normal to said reflective surface such that at least some of said light is retroreflected back to said diffractive optical element, onto said collimation region and to said first semiconductor laser, wherein at least a portion of light from said second semiconductor laser having a second wavelength different than the first wavelength is incident on said diffractive optical element at an angle and diffracted by said diffractive optical element so as to be normal to said reflective surface such that at least some of said light is retroreflected back to said diffractive optical element, onto said collimation region and to said second semiconductor laser, and wherein at least a portion of said light from said first and second semiconductor lasers is transmitted through said reflective surface at normal incidence to said reflective surface such that light from said first and second lasers transmitted through said reflective surface is more parallel to each other than light from said first and second lasers incident on said diffractive optical element and is thus light from said semiconductor array is more collimated upon output from said laser light source.

Example 2: The laser light source of Example 1, wherein said semiconductor laser array comprises a diode bar.

Example 3: The laser light source of Example 2, wherein said diode bar exhibits smile.

Example 4: The light source of any of Examples 1 or 2, wherein said first direction is horizontal and said second direction is vertical and semiconductor lasers are arranged along an arcuate path with semiconductors lasers more central in said arcuate path of said array lower than semiconductor lasers at the ends of said array or with semiconductors lasers more central in said array higher than semiconductor lasers at the ends of said array.

Example 5: The laser light source of any of the examples above, wherein said semiconductor lasers comprise waveguide lasers having a waveguide with a length and a cross-section orthogonal to said length, said cross-section wider than high such that said semiconductor lasers have a fast axis and a slow axis orthogonal to said fast axis, said slow axis along said first direction and said fast axis along said second direction.

Example 6: The laser light source of Example 5, wherein said cross-section orthogonal to said length is rectangular.

Example 7: The laser light source of any of the examples above, wherein said collimating optics has different lens power along said first direction as compared to along said second direction.

Example 8: The light source of Example 7, wherein said collimating optics has more lens power along said second direction as compared said first direction.

Example 9: The laser light source of any of the examples above, wherein said collimating optics has a focal length and is positioned a focal length away from said plurality of semiconductor lasers to increase collimation of the diverging laser light beams emitted by the semiconductor lasers.

Example 10: The laser light source of any of the examples above, wherein said collimating optics comprises one or more lenses.

Example 11: The laser light source of Examples 10, wherein said one or more lenses comprises at least one cylindrical or acylindrical lens.

Example 12: The laser light source of any of the examples above, wherein said collimating optics comprises at least one anamorphic surface.

Example 13: The laser light source of any of the examples above, wherein said collimating optics comprises at least one cylindrical or acylindrical surface.

Example 14: The laser light source of any of the examples above, wherein said diffractive optical element comprises volume diffractive optical element.

Example 15: The laser light source of any of the examples above, wherein said diffractive optical element comprises surface diffractive optical element.

Example 16: The laser light source of any of the examples above, wherein said diffractive optical element comprises diffraction grating.

Example 17: The laser light source of any of the examples above, wherein said diffractive optical element comprises a transmissive diffractive optical element configured to diffract transmitted light.

Example 18: The laser light source of any of the examples above, wherein said diffractive optical element comprises a reflective diffractive optical element configured to diffract reflected light.

Example 19: The laser light source of any of the examples above, wherein said diffractive optical element and said reflective surface are integrated together in the same optical element.

Example 20: The laser light source of any of Examples 19, wherein said optical element comprises a transmissive medium including said diffractive optical element on one side and said reflective surface on another side.

Example 21: The laser light source of Example 19, wherein said optical element comprises a transmissive medium including said diffractive optical element disposed on a first surface of said optical element and said reflective surface comprises a second surface of said optical element.

Example 22: The laser light source of any of the claims above, wherein said collimating optics and said diffractive optical element are integrated together on the same optical element.

Example 23: The laser light source of Example 22, wherein said optical element comprises an optically transmissive medium having a lens surface on one side and said diffractive optical element on another side.

Example 24: The laser light source of Example 22 or 23, wherein said optical element comprises a lens having a surface with refractive optical power on one side and said diffractive optical element on another side.

Example 25: The laser light source of any of the claims above, wherein said collimating optics, said diffractive optical element, and said reflective surface are integrated together on the same optical element.

Example 26: The laser light source of Example 25, wherein said optical element comprises an optically transmissive medium having a lens surface and said diffractive optical element, and said reflective surface comprises another surface of said optically transmissive medium.

Example 27: The laser light source of Example 25, wherein said optical element comprises an optically transmissive medium having a lens surface on a first surface, and said reflective surface comprises a second surface of said optically transmissive medium.

Example 28: The laser light source of any of the examples above, wherein light from said plurality of semiconductor lasers that is transmitted through said reflective surface is more collimated than light from said plurality of semiconductor lasers that is incident on said diffractive optical element to be directed to said reflective surface.

Example 29: The laser light source of any of the examples above, wherein said light from said first and second semiconductor lasers that is transmitted through said reflective surface is more collimated than said light from said first and second semiconductor lasers that is incident on said diffractive optical element to be directed to said reflective surface.

Example 30: The laser light source of any of the examples above, wherein said reflective surface has a reflectivity from 10% to 90%.

Example 31: The laser light source of any of the examples above, wherein said first and second laser semiconductor lasers have output facets having an anti-reflective coating thereon.

Example 32: The laser light source of any of the examples above, wherein said semiconductor lasers have fast and slow axes, said first direction parallel to the slow axis of said semiconductor lasers and said second direction parallel to the fast axis of said semiconductor lasers.

Example 33: The laser light source of any of the examples above, wherein said dispersion region has an amount of dispersion such that laser light transmitted through said reflective surface have wavelengths within a range of less than 32 nm nanometers.

Example 34: The laser light source of any of the examples above, wherein said plurality of semiconductor lasers comprises at least three semiconductor lasers.

Example 35: The laser light source of any of the examples above, wherein said retroreflecting at least some of said light from said first laser back to said diffractive optical element, onto said collimating optics and to said first semiconductor laser lowers the laser threshold of said first semiconductor laser for said first wavelength.

Example 36: The laser light source of any of the examples above, wherein said retroreflecting at least some of said light from said second laser back to said diffractive optical element, onto said collimating optics and to said second semiconductor laser lowers the laser threshold of said second semiconductor laser for said second wavelength.

Example 37: The laser light source of any of the examples above, wherein said plurality of semiconductor lasers comprises a third semiconductor laser having a different position both along said first and second directions than said first and second semiconductor lasers, said third semiconductor laser configured to output a diverging beam of laser light having a bandwidth that includes a plurality of wavelengths.

Example 38: The laser light source of Examples 37, wherein said collimating optics is disposed to receive said laser light from said third semiconductor laser and configured to transmit light from said third semiconductor laser that is more collimated.

Example 39: The laser light source of Example 38, wherein a portion of the light from said third semiconductor laser having a third wavelength different from said first and second wavelengths is incident on said diffractive optical element at an angle and is diffracted by said diffractive optical element at an angle so as to be normal to said reflective surface such that at least some of said light is retroreflected back to said diffractive optical element, onto said collimating optics and to said third semiconductor laser.

Example 40: The laser light source of Example 39, wherein said retroreflecting at least some of said light from said third laser back to said dispersion region, onto said collimation region and to said third semiconductor laser lowers the laser threshold of said third semiconductor laser for said third wavelength.

Example 41: The laser light source of any of the examples above, wherein said diffractive optical element is configured such that said first and second wavelengths if emitted by said third semiconductor laser and incident on said diffractive optical element would not be diffracted by said diffractive optical element so as to be normal to said reflective surface and retroreflected back to said diffractive optical element, said collimating optics, and said third semiconductor laser.

Example 42: The laser light source of any of the examples above, wherein said diffractive optical element is configured such that said first wavelength if emitted by said second semiconductor laser and incident on said diffractive optical element would not be diffracted by said diffractive optical element so as to be normal to said reflective surface and be retroreflected back to said diffractive optical element, said collimating optics, and said second semiconductor laser.

Example 43: The laser light source of any of the examples above, wherein said diffractive optical element is configured such that said second wavelengths if emitted by said first semiconductor laser and incident on said diffractive optical element would not be diffracted by said diffractive optical element so as to be normal to said reflective surface and retroreflected back to said diffractive optical element, said collimating optics, and said first semiconductor laser.

Terminology

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A laser light source comprising:
a semiconductor laser array comprising a plurality of semiconductor lasers arranged along a first direction, at least some of said semiconductor lasers also having different positions along a second direction orthogonal to said first direction, said plurality of semiconductor lasers including first and second semiconductor lasers having different positions both along said first and second directions, said first and second semiconductor lasers outputting diverging beams of laser light having a bandwidth that includes a plurality of wavelengths;
a collimation region disposed to receive said laser light from said first and second semiconductor lasers and configured to transmit laser light from said first and second semiconductor lasers that is more collimated;
a dispersion region having angular dispersion disposed to receive light from said first and second lasers that is transmitted through said collimation region, said dispersion region configured to distribute different wavelengths of said plurality of wavelengths in different directions; and
a reflective surface that is partially reflective and partially transmissive positioned to receive said different wavelengths from said dispersion region and reflect a portion of said light back to said dispersion region,
wherein at least a portion of light from said first semiconductor laser having a first wavelength is incident on said dispersion region and transmitted through or reflected from said dispersion region so as to be normal to said reflective surface such that at least some of said light is retroreflected back to said dispersion region, onto said collimation region and to said first semiconductor laser, and
wherein at least a portion of light from said second semiconductor laser having a second wavelength different than the first wavelength is incident on said dispersion region at an angle and transmitted through or reflected form said dispersion region and re-directed so as to be normal to said reflective surface such that at least some of said light is retroreflected back to said dispersion region, onto said collimation region and to said second semiconductor laser, and
wherein at least a portion of said light from said first and second semiconductor lasers is transmitted through said reflective surface at normal incidence to said reflective surface such that light from said first and second lasers transmitted through said reflective surface is more parallel to each other than light from said first and second lasers incident on said dispersion region and is thus light from said semiconductor array is more collimated upon output from said laser light source.

2. The laser light source of claim 1, wherein said semiconductor laser array comprises a diode bar.

3. The laser light source of claim 2, wherein said diode bar exhibits smile.

4. The light source of claim 1, wherein said first direction is horizontal and said second direction is vertical and semiconductor lasers are arranged along an arcuate path with semiconductors lasers more central in said arcuate path of said array lower than semiconductor lasers at the ends of said array or with semiconductors lasers more central in said array higher than semiconductor lasers at the ends of said array.

5. The laser light source of claim 1, wherein said semiconductor lasers comprise waveguide lasers having a waveguide with a length and a cross-section orthogonal to said length, said cross-section wider than high such that said semiconductor lasers have a fast axis and a slow axis orthogonal to said fast axis, said slow axis along said first direction and said fast axis along said second direction.

6. The laser light source of claim 1, wherein said dispersion region comprises a diffractive optical element.

7. The laser light source of claim 1, wherein said dispersion region comprises a transmissive diffractive optical element configured to diffract transmitted light.

8. The laser light source of claim 1, wherein said dispersion region comprises a reflective diffractive optical element configured to diffract reflected light.

9. The laser light source of claim 1, wherein said dispersion region comprises a prism configure to refract light, said refraction being wavelength dependent.

10. The laser light source of claim 1, wherein said dispersion region and said reflective surface are integrated together in the same optical element.

11. The laser light source of any of claim 10, wherein said optical element comprises an optically transmissive medium including a diffractive optical element on one side and said reflective surface on another side.

12. The laser light source of claim 1, wherein said collimation region, said dispersion region, and said reflective surface are integrated together on the same optical element.

13. The laser light source of claim 1, wherein said reflective surface has a reflectivity from 10% to 90%.

14. The laser light source of claim 1, wherein said semiconductor lasers have fast and slow axes, said first direction parallel to the slow axis of said semiconductor lasers and said second direction parallel to the fast axis of said semiconductor lasers.

15. The laser light source of claim 1, wherein said dispersion region has an amount of dispersion such that laser light transmitted through said reflective surface have wavelengths within a range of less than 32 nm nanometers.

16. The laser light source of claim 1, wherein said plurality of semiconductor lasers comprises at least three semiconductor lasers.

17. The laser light source of claim 1, wherein said retroreflecting at least some of said light from said first laser back to said dispersion region, onto said collimation region and to said first semiconductor laser lowers the laser threshold of said first semiconductor laser for said first wavelength.

18. The laser light source of claim 1, wherein said plurality of semiconductor lasers comprises a third semiconductor laser having a different position both along said first and second directions than said first and second semi-conductor lasers, said third semiconductor laser configured to output a diverging beam of laser light having a bandwidth that includes a plurality of wavelengths.

19. The laser light source of claim 18, wherein said dispersion region is configured such that said first and second wavelengths if emitted by said third semiconductor laser and incident on said dispersion region would not be transmitted through or reflected from said dispersion region so as to be normal to said reflective surface and be retrore-flected back to said dispersion region, said collimation region, and said third semiconductor laser.

20. The laser light source of claim 1, wherein said dispersion region is configured such that said first wave-lengths if emitted by said second semiconductor laser and incident on said dispersion region would not be transmitted through or reflected from said dispersion region so as to be normal to said reflective surface and retroreflected back to said dispersion region, said collimation region, and said second semiconductor laser.

* * * * *